(12) United States Patent  
Chen et al.

(10) Patent No.: US 8,310,466 B2  
(45) Date of Patent: *Nov. 13, 2012

(54) METHOD OF MOUNTING THUMBWHEEL SWITCH ON PRINTED CIRCUIT BOARD AND HANDHELD ELECTRONIC DEVICE INCORPORATING THE SAME

(75) Inventors: Chao Chen, Waterloo (CA); Timothy H. Kyowski, Kitchener (CA); Jason T. Griffin, Kitchener (CA)

(73) Assignee: Research In Motion Limited, Waterloo, Ontario (CA)

( * ) Notice: Subject to any disclaimer, the term of this patent is extended or adjusted under 35 U.S.C. 154(b) by 359 days.

This patent is subject to a terminal disclaimer.

(21) Appl. No.: 12/625,688

(22) Filed: Nov. 25, 2009

(65) Prior Publication Data

US 2010/0066706 A1   Mar. 18, 2010

Related U.S. Application Data

(63) Continuation of application No. 10/967,695, filed on Oct. 15, 2004, now Pat. No. 7,639,240.

(51) Int. Cl.
  *G09G 5/00*   (2006.01)
  *G06F 3/033*   (2006.01)
(52) U.S. Cl. ....................................... 345/184
(58) Field of Classification Search ............ 345/184, 345/168, 169; 174/262, 263
See application file for complete search history.

(56) References Cited

U.S. PATENT DOCUMENTS

| | | | |
|---|---|---|---|
| 3,809,830 A | 5/1974 | Lockard et al. | |
| 4,007,443 A | 2/1977 | Bromberg et al. | |
| 4,199,721 A * | 4/1980 | Ono et al. | 455/77 |
| 5,477,508 A * | 12/1995 | Will | 368/189 |
| 5,696,363 A | 12/1997 | Larchevesque | |
| 5,930,601 A * | 7/1999 | Cannizzaro et al. | 438/122 |
| 6,008,608 A * | 12/1999 | Holsten et al. | 318/544 |
| 6,215,665 B1 | 4/2001 | Martin | |
| 6,489,950 B1 | 12/2002 | Griffin et al. | |
| 6,545,229 B1 * | 4/2003 | Ma et al. | 174/263 |
| 6,611,255 B2 | 8/2003 | Griffin et al. | |
| D490,119 S | 5/2004 | Griffin et al. | |
| 6,853,290 B2 * | 2/2005 | Jorgensen et al. | 338/200 |
| 7,639,240 B2 * | 12/2009 | Chen et al. | 345/184 |
| 2002/0086774 A1 * | 7/2002 | Warner | 482/8 |
| 2002/0139648 A1 | 10/2002 | Hoskins et al. | |
| 2002/0152609 A1 * | 10/2002 | Choi et al. | 29/830 |
| 2003/0024799 A1 | 2/2003 | Jorgensen et al. | |
| 2004/0258500 A1 | 12/2004 | Ireland | |

FOREIGN PATENT DOCUMENTS

| | | |
|---|---|---|
| GB | 1 044 809 | 10/1966 |
| GB | 1 259 902 | 1/1972 |
| GB | 1 399 577 | 7/1975 |

* cited by examiner

*Primary Examiner* — Quan-Zhen Wang  
*Assistant Examiner* — Calvin C Ma  
(74) *Attorney, Agent, or Firm* — Gowling Lafleur Henderson LLP

(57) ABSTRACT

A thumbwheel switch for a handheld electronic device is mechanically and electrically mounted on the substrate of a printed circuit board using SMT with the thumbwheel seated in a cutout in the substrate and with the top surface of the thumbwheel about flush with the top surface of the substrate so that the thumbwheel is ergonomically positioned on the side of the handheld electronic device at the level of the display.

13 Claims, 5 Drawing Sheets

METHOD OF MOUNTING THUMBWHEEL SWITCH ON PRINTED CIRCUIT BOARD AND HANDHELD ELECTRONIC DEVICE INCORPORATING THE SAME

CROSS-REFERENCE TO RELATED APPLICATIONS

The instant application is a continuation of U.S. patent application Ser. No. 10/967,695, titled "Method of Mounting Thumbwheel Switch on Printed Circuit Board and Handheld Electronic Device Incorporating Same" filed on Oct. 15, 2004, the contents of which are incorporated herein by reference.

BACKGROUND OF THE INVENTION

1. Field of the Invention

Aspects of this invention relate to handheld electronic devices and user interfaces for such devices such as a thumbwheel switch and to methods of assembling the devices.

2. Background Information

Handheld electronic devices are in widespread use. Some utilize as part of user interface a thumbwheel switch that can be used to scroll through and make selections from actions or entries presented on a display. Typically, a portion of the thumbwheel protrudes from the side of the housing where it can be manipulated easily by the thumb as the device is held in the palm of the user's hand. The thumbwheel switch generates electrical signals that must be passed to circuits provided usually on a printed circuit board contained within the housing of the handheld electronic device. Some factors that need to be considered when providing thumbwheel switches in handheld electronic devices include: ease of use of the thumbwheel switch, the shrinking overall size of the handheld electronic devices, the accommodation of larger displays, and the trend toward automatic assembly.

A current handheld electronic device has a thumbwheel switch and other components that are mechanically secured to a printed circuit board and electrically connected to the circuits of the printed circuit board using surface mounting technology (SMT). In this process, solder is screen printed to form contact pads on the printed circuit board substrate. The components, including the thumbwheel switch, are pressed into the solder at the appropriate locations and the assembly is passed through an oven that melts the solder, which then cools to mechanically and electrically connect the thumbwheel switch and other components to the printed circuit board. However, the thumbwheel itself is mounted on a body of the thumbwheel switch which in turn is seated on the printed circuit board so that the wheel is offset considerably from the plane of the printed circuit board substrate. When the printed circuit board is installed in the housing in a plane generally parallel to the front surface of the housing of the handheld electronic device, the thumbwheel is positioned behind the printed circuit board well below the front of the device where it is less comfortable to operate. The thumbwheel switch cannot be positioned in front of the printed circuit board because of interference with the device's display, typically a liquid crystal display (LCD).

In another handheld electronic device, the thumbwheel switch is mounted on a separate board that allows it to be installed in the device with the axis of rotation of the wheel at an angle to the face of the device. While this is ergonomically more satisfactory, it has important disadvantages. First, it requires more depth in the housing, and therefore, it cannot overlap the display. This means that the overall width of the device must be greater and/or the display must be made narrower. Second, it makes the device more costly to assemble as separate electrical connections are required between the switch and the circuits of the printed circuit board and additional assembly steps that are more difficult to automate are needed to mount the switch and make the electrical connections.

One handheld electronic device moves the wheel of the thumbwheel switch into a cutout in the edge of the substrate of the printed circuit board so that it is in the plane of the substrate. However, the thumbwheel switch is secured to the printed circuit board by screws, thus requiring additional assembly steps. Furthermore, a ribbon connector is required to electrically connect the switch to the circuits of the printed circuit board. Again, this adds steps to the assembly process and requires additional space on the printed circuit board.

In summary, there is room for improvement in providing handheld electronic devices with thumbwheel switches.

SUMMARY OF THE INVENTION

In accordance with aspects of the invention, a handheld electronic device has a thumbwheel switch mounted on a printed circuit board using surface mounting technology with the thumbwheel in registration with a cutout in the substrate of the printed circuit board. Thus, the advantages of assembly through the use of surface mounting technology, which can be machine implemented, are realized while also gaining the benefits of more ergonomically satisfactory placement of the thumbwheel.

More particularly, aspects of the invention are directed to a handheld electronic device comprising a housing having a front face and components supported by the housing. The components comprise a user interface that itself comprises a thumbwheel switch and a printed circuit board having a planar substrate and electronic components mounted on the planar substrate and electrically connected by electrical traces. The planar substrate is mounted in the housing generally parallel to the front face. The substrate has an edge cutout. The thumbwheel switch has a body and a thumbwheel, the body being both mechanically and electrically connected essentially by solder to the substrate and to the electrical traces with the thumbwheel seated in and rotatable within the edge cutout. The substrate has solder pads and the thumbwheel switch has leads extending from the body that are embedded in the solder pad. Some of the leads are mechanical leads only. The substrate can have holes filled with solder in which some of the mechanical leads are embedded. The body can also have some L-shaped mechanical leads having a first flange secured to a sidewall of the body and a second flange flush with and secured to a first face of the substrate with solder.

In addition, the substrate of the printed circuit board can have locating holes and the body can have locating pins that seat in these locating holes. In accordance with other aspects of the invention, the body of the thumbwheel switch can extend beyond the thumbwheel in at least two opposite directions and at least two of the locating pins can be located on the body beyond the thumbwheel in these two opposite directions.

In accordance with additional aspects of the invention, the thumbwheel is seated in a recess in a top face of the body of the thumbwheel switch and extends above the top face about a thickness of the planar substrate so that with the body seated on the substrate with the top face seated on a first face of the planar substrate, the thumbwheel is about flush with a second face of the planar substrate. The components of the handheld electronic device can further include a display mounted in the front face of the housing. The printed circuit board can be mounted in the housing with the planar substrate generally parallel to the front face and with the thumbwheel switch extending partially behind the display with the thumbwheel accessible through a side opening in the housing. In accordance with certain aspects of the invention, the housing has two parts joined along a parting line generally in a plane substantially parallel to the front face and the side opening is at the parting line.

The invention also embraces a method of assembling a thumbwheel switch having a body and a thumbwheel and electronic components on a printed circuit board for a handheld electronic device where the printed circuit board has a substrate with electrical traces and an edge cutout and wherein the thumbwheel body and the electronic components have leads thereon at least some of which are circuit leads. The method comprises: applying solder paste to spots on the substrate to form solder pads that for at least the circuit leads engage selected electrical traces. The method includes positioning the body of the thumbwheel switch and the electronic components on the substrate with at least the circuit leads engaging solder pads to form an assembly and with the thumbwheel seated in the edge cutout. The leads are secured to the printed circuit board essentially by: heating the assembly to melt the solder pads and wet the leads with solder, and solidifying the solder by cooling to mechanically secure and electrical connect the thumbwheel switch and the electronic components to the printed circuit board. In accordance with aspects of the invention, the body of the thumbwheel switch can have locating pins and the substrate can have positioning holes so that the positioning step includes engaging the locating pins in the positioning holes. In accordance with another aspect of the invention, the thumbwheel is seated in a recess in the front face of the body of the thumbwheel switch and extends above the front face about the thickness of the planar substrate. Thus, with the thumbwheel switch positioned on the printed circuit board with the front face of the body seated on a first face of the planar substrate, the thumbwheel is about flush with a second face of the planar substrate. In accordance with yet other aspects of the invention, some of the leads on the body of the thumbwheel switch are mechanical and project from the body. In this instance, the substrate has corresponding recesses in which solder paste is applied and the body of the thumbwheel switch is positioned with the mechanical leads extending into the solder paste in the corresponding recesses.

In accordance with another aspect of the invention, the thumbwheel switch and electronic components are positioned on the substrate by a machine.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENTS

Figure 1:
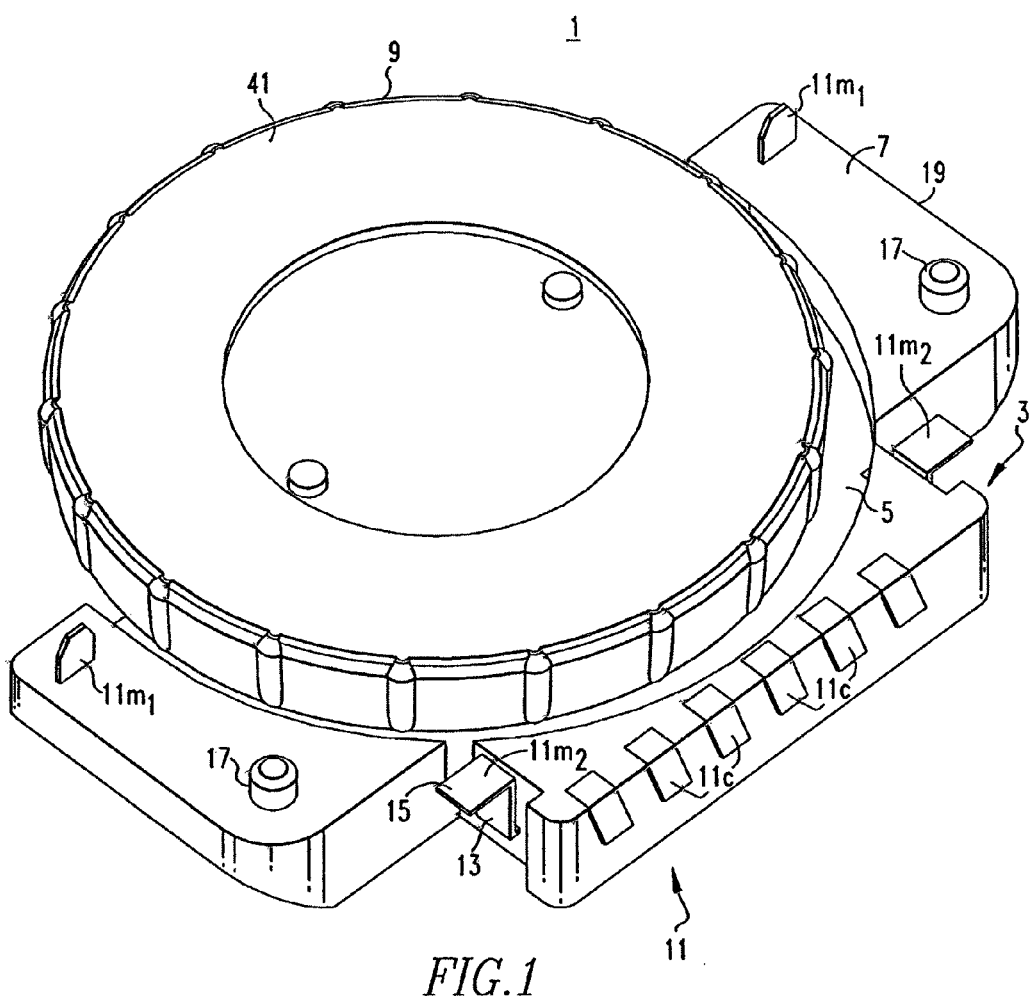
FIG. 1 is an isometric view of a thumbwheel switch in accordance with aspects of the invention.
Figure 2:
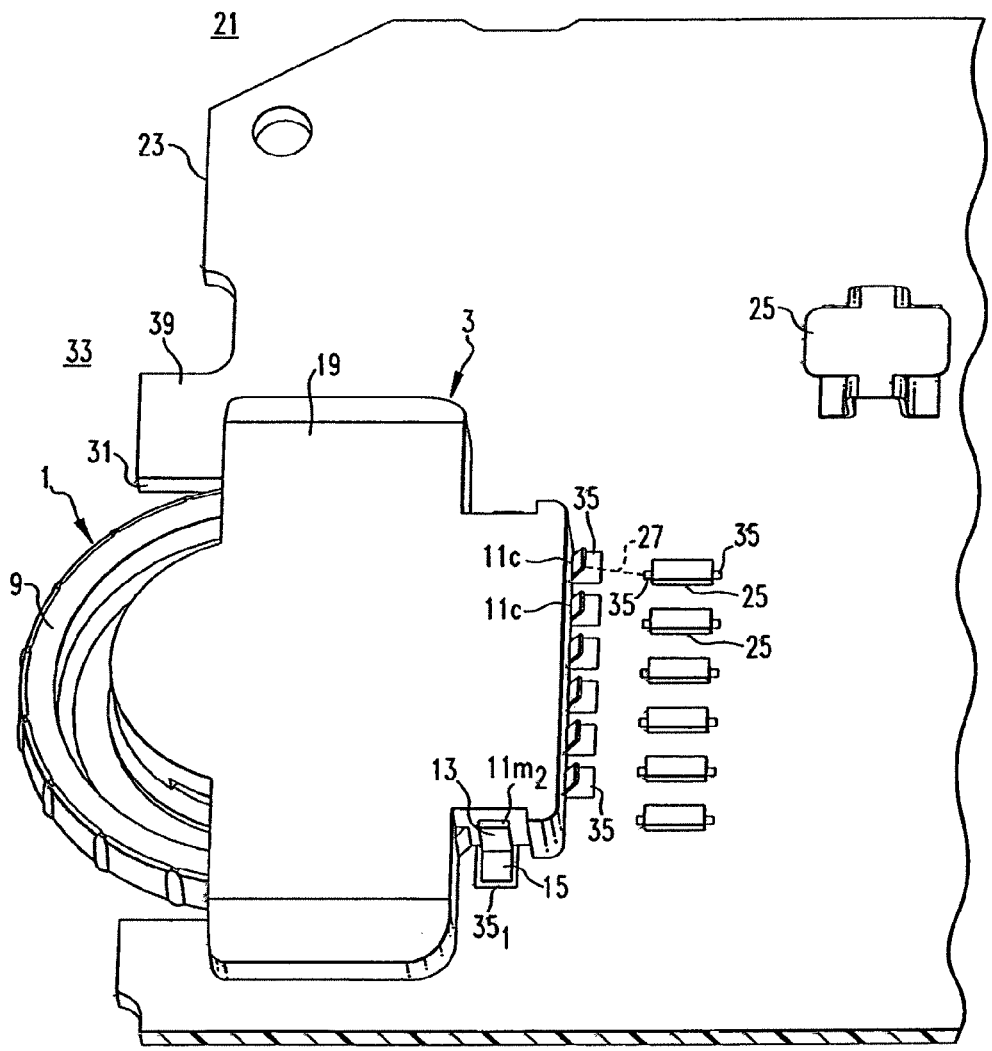
FIG. 2 is a fragmentary isometric view of the underside of a printed circuit board on which the thumbwheel switch of FIG. 1 is mounted.

FIG. 1 illustrates a thumbwheel switch 1 in accordance with aspects of the invention. The thumbwheel switch 1 has a body 3 containing a potentiometer (not shown) and other electronic components as is well known. The body 3 has a recess 5 in a top face 7 in which a thumbwheel 9 is rotatably mounted and connected to the potentiometer. The thumbwheel switch 1 has a plurality of leads 11 projecting from the body 3. This includes in the exemplary thumbwheel switch six circuit leads $11c$ that are best seen in FIG. 2 and several mechanical leads $11m$. These mechanical leads include the metal posts $11m_1$ and two L-shaped mechanical leads $11m_2$. The L-shaped mechanical leads $Lm_2$ are angle members having a first flange 13 that is secured to the body 3 and a second flange 15 that is perpendicular to the flange 13 and is flush with the top surface 7 of the body 3. In addition, two locating pins 17 project from the top face 7 of the body 3. The body 3 is T-shaped with the crossbar 19 on which the thumbwheel 9 is mounted extending beyond the thumbwheel 9 in two opposite directions, that is, the crossbar 19 is longer than the diameter of the thumbwheel. The two metal posts $11m_1$ are positioned on the crossbar 19 on opposite sides of the thumbwheel 9 as are the two locating pins 17. While the exemplary thumbwheel switch 1 has six circuit leads $11c$, two metal post mechanical leads $11m_1$, two L-shaped mechanical leads $11m_2$ and two locating pins 17, other numbers of any or all these leads 11 could be provided on the body 3 and could be located differently. The positioning of the metal posts $11m_1$ and locating pins 17 near the outer extremities of the crossbar 19 on either side of the thumbwheel 9, however, provides good stability for the thumbwheel switch 1.

Figure 3:
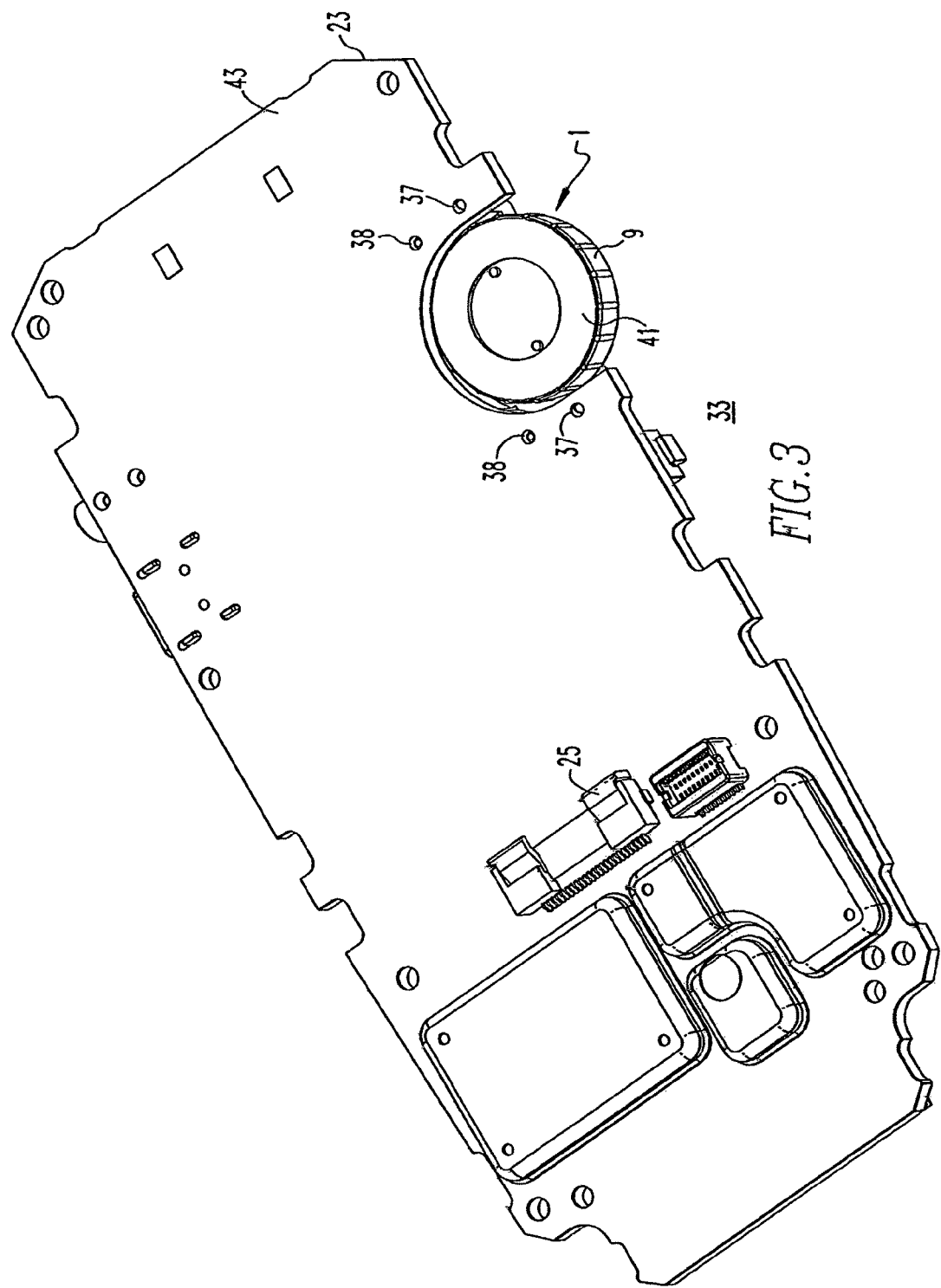
FIG. 3 is an isometric view of the other side of the printed circuit board.
Figure 4:
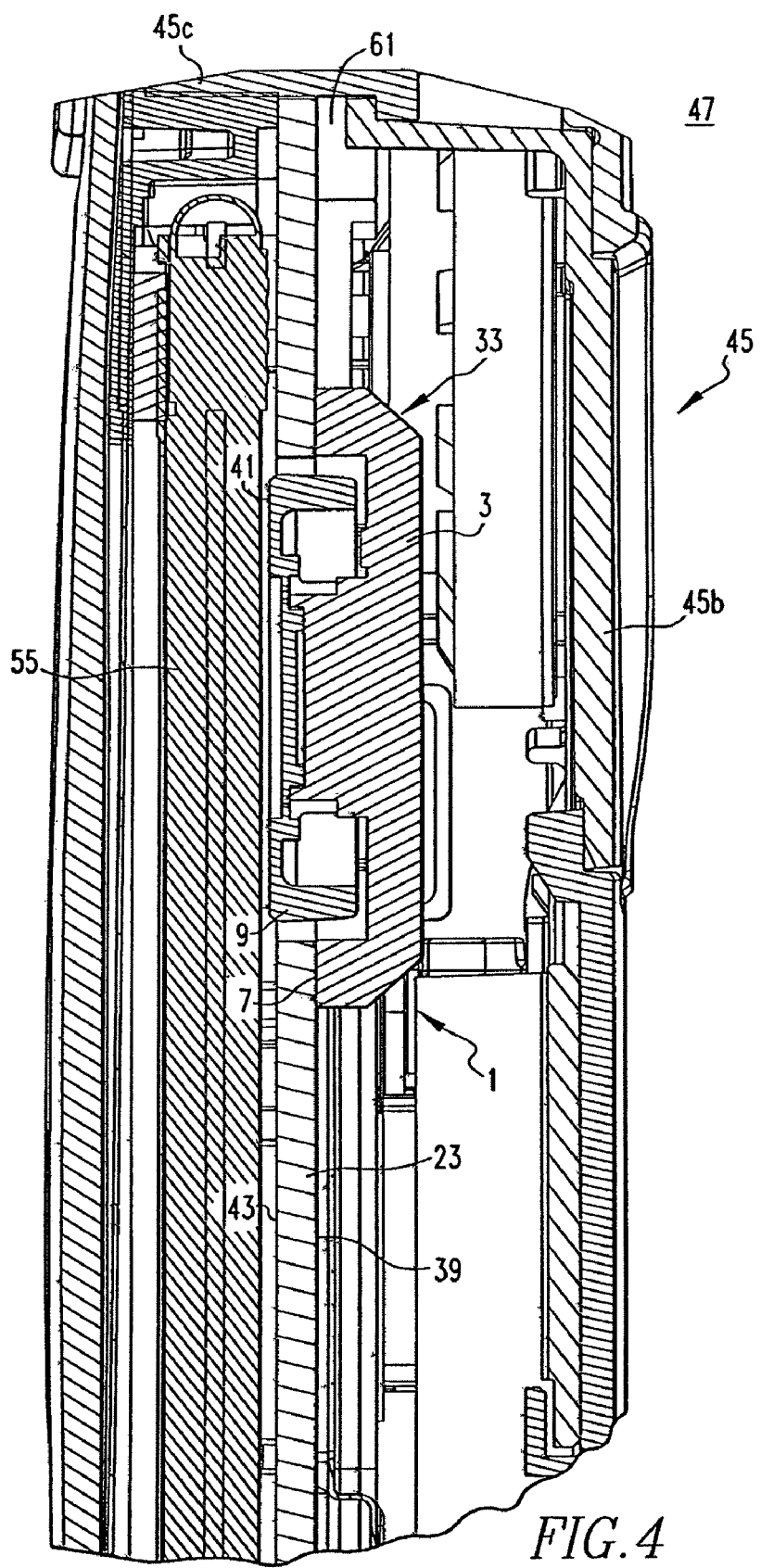
FIG. 4 is a fractional sectional view through a handheld electronic device incorporating the printed circuit board with the thumbwheel switch.

In accordance with additional aspects of the invention, the thumbwheel switch 1 is mounted on a printed circuit board 21 using SMT (surface mounting technology) in a manner to be discussed. As can be seen in FIGS. 2-4, the printed circuit board 21 constitutes a planar substrate 23 on which are mounted, again using SMT, a number of electronic components 25. The electronic components 25 are interconnected to form an electronic circuit by electrical traces 27. The exemplary planar substrate 23 is formed in layers with the electrical traces 27 sandwiched between layers and electrically interconnected through holes (not shown in FIG. 2) as is known. Only one electrical trace 27 is shown in FIG. 2 for clarity.

The substrate 23 has an edge cutout 31 that is partially circular. In accordance with aspects of the invention, the thumbwheel switch 1 and electronic components 25 are mounted on the planar substrate 23 using SMT to form a printed circuit board assembly 33. Solder paste is screened onto the substrate 23 to form solder pads 35. Additional solder pads 35 can be formed for the mechanical leads 11. These solder pads 35 can just be on the surface of the substrate, as indicated by the solder pad $35_1$. Other solder pads for mechanical leads such as the leads $11m_1$ can extend through addition holes 37 which may extend all the way through the substrate 23 (see FIG. 3). The solder pads 35 are formed by screening solder paste onto the substrate 23 at the desired locations. The thumbwheel switch 1 and the electronic components are then positioned on the substrate with their leads 11 embedded in the corresponding solder pads 35. The thumbwheel switch 1 is positioned on the substrate 23 with the top face 7 of the body 3 abutting a first face 39 of the substrate by aligning the locating pins 17 with locating holes 38 in the substrate so that the thumbwheel 9 registers with the edge cutout 31. The thickness of the thumbwheel 9 is such that the top surface 41 of the thumbwheel 9 is about flush with the second face 43 of the substrate 23. With the thumbwheel switch 1 so positioned, the metal posts $11m_1$ engage the holes 37 in the substrate. These holes 37 can have solder paste in them or not. In the latter case, the holes 37 can be dimensioned so that the metal posts $11m_1$ are press fit to aid in mechanical connection of the thumbwheel switch 1 to the substrate 23. The flanges 15 on the mechanical leads $11m_2$ become embedded in the solder paste of solder pads 35. The locating pins 17 engage locating holes 38 in the substrate to properly register the thumbwheel 19 in the edge cutout 31.

As mentioned, the thumbwheel switch 1 and electronic components 25 are mounted on the substrate 23 utilizing SMT. In accordance with this procedure, solder paste is screened onto the substrate 23 to form the solder pads 35. The body 3 of the thumbwheel switch 1 and the electronic components 25 are then positioned on the substrate with at least the circuit leads 11c engaging the solder pads 35 to form the printed circuit board assembly 33. The thumbwheel body is positioned in the manner described above with the thumbwheel 9 seated in the edge cutout 31 in the planar substrate 23. This positioning of the thumbwheel switch 1 and electronic components 25 is preferably carried out by machine such as by a robot. The leads 11 are then secured to the printed circuit board essentially by: heating the assembly 33 to melt the solder pads 35 and wet the leads 11 with solder. The solder is then solidified by cooling to mechanically secure and electrically connect the thumbwheel switch 1 and the electronic components 25 to the substrate 23. The circuit leads 11c perform the dual function of electrically connecting the thumbwheel switch 1 and electronic components 25 through the electrical traces 27 incorporated in the substrate 23 and also provide at least some mechanical support. Further mechanical support can be provided by including the mechanical leads, which can be either or both of the posts $11m_1$ and the angle members $11m_2$. Additionally, the locating pins could be used as additional mechanical leads by sizing them to press fit into the holes 38 in the substrate 23.

Figure 5:
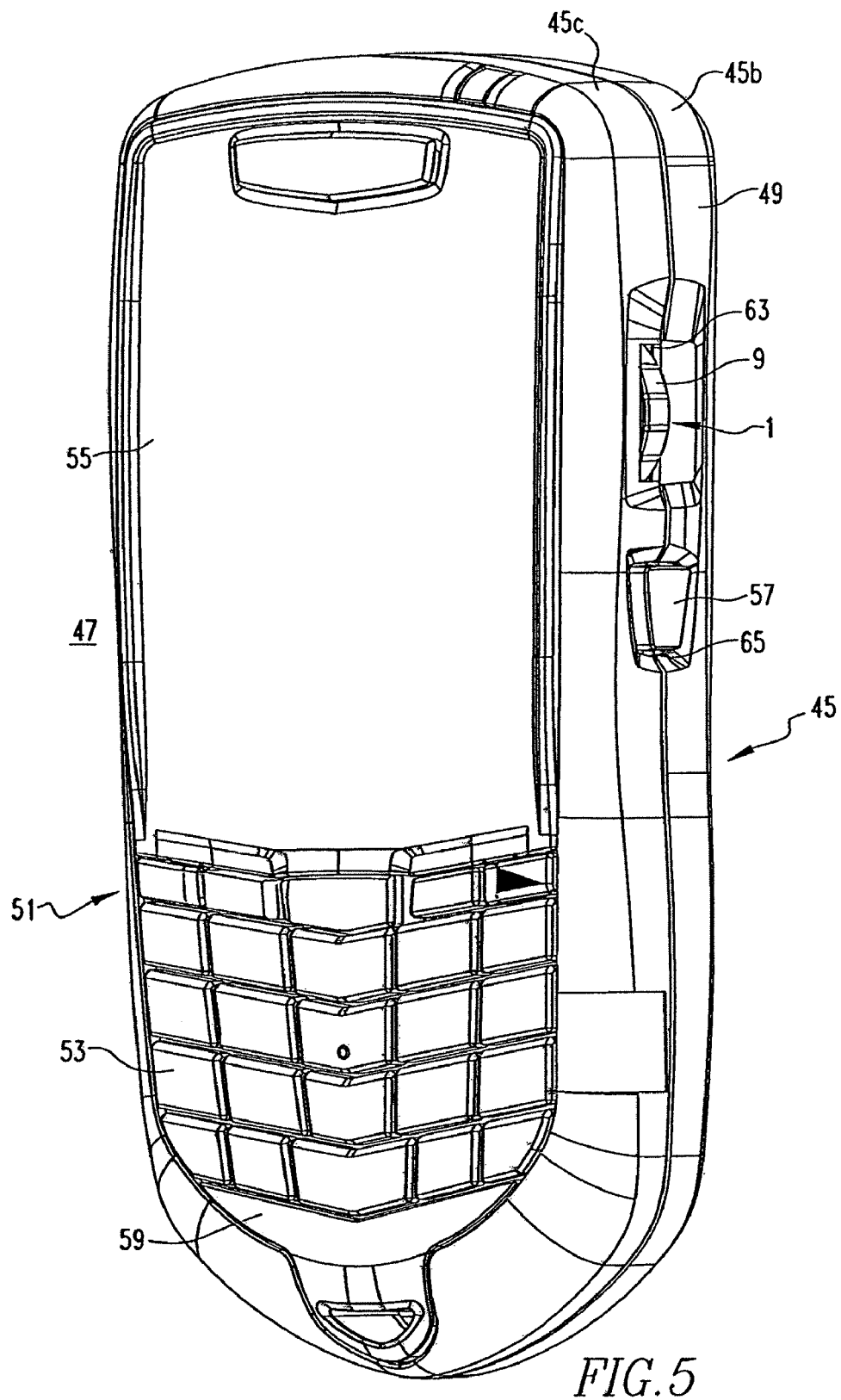
FIG. 5 is an isometric view of the handheld electronic device incorporating the thumbwheel switch in accordance with aspects of the invention.

The printed circuit board assembly 33 when completed is installed in the housing 45 of a handheld electronic device 47 as shown in FIGS. 4 and 5. The housing 45 has a base part 45b and a cover part 45c which are joined along a parting line 49. The handheld electronic device 47 has a user interface 51 that includes a keyboard 53, a display 55 such as a liquid crystal display (LCD), the thumbwheel switch 1 and an escape button 57. The keyboard 53 and LCD 55 are mounted in the front face 59 of the cover 45c and protrude into the cavity 61 formed by the two halves of 45b and 45c of the housing 45. When the printed circuit board assembly 33 is installed in the housing cavity 61, with the planar substrate 23 generally parallel to the front face 59 of the housing 45, the thumbwheel 9 protrudes through an opening 63 in the housing at the parting line 49. The escape button 57 similarly protrudes through an opening 65 at the parting line 49. Ergonomically the thumbwheel 9 is positioned vertically on the side of the housing 45 within the vertical extent of the LCD 55. However, as the thumbwheel is mounted on the substrate 23 so that it does not protrude above the second face 43 of the substrate, it does not interfere with the LCD 55 and can be positioned forward toward the front face 59 of the housing so that it can be comfortably used.

It can be appreciated from the above, that aspects of the invention allow the thumbwheel 9 to be ergonomically located on the side of the housing 45 of the handheld electronic device 47 adjacent the LCD 55, and still be efficiently mounted on the substrate of the printed circuit board using SMT.

While specific embodiments of the invention have been described in detail, it will be appreciated by those skilled in the art that various modifications and alternatives to those details may be developed in light of the overall teachings of the disclosure. Accordingly, the particular arrangements disclosed are meant to be illustrative only and not limiting as to the scope of the invention which is to be given the full breadth of the claims appended and any and all equivalents thereof.

What is claimed is:

1. A handheld electronic device comprising:
a housing having a front face; and
components supported by the housing comprising:
a thumbwheel switch having a body and a thumbwheel, the body having a top face, a recess formed in the top face, and the thumbwheel seated in the recess of the top face, the thumbwheel rotatably mounted on the top face of the body;
a printed circuit board having a planar substrate and electronic components mounted on the planar substrate and electrically connected by electrical traces, the planar substrate being mounted in the housing generally parallel to the front face and having an edge cutout formed in the planar substrate, the planar substrate having a first face and a second face, the top face of the body of the thumbwheel switch being both mechanically and electrically connected essentially by solder to the first face of the planar substrate such that the body is positioned on the planar substrate with the top face of the body seated on the first face of the planar substrate, the top face of the body abutting the first face of the planar substrate, and the electrical traces with the thumbwheel seated in and rotatable within the edge cutout; and
a display mounted in the front face of the housing, the printed circuit board being mounted in the housing with the planar substrate generally parallel to the front face, the thumbwheel switch located substantially behind the display and with the thumbwheel accessible through a side opening in the housing.

2. The handheld electronic device of claim 1 wherein the thumbwheel extends above the top face of the body of the thumbwheel switch about a thickness of the planar substrate such that the thumbwheel is about flush with the second face of the planar substrate.

3. The handheld electronic device of claim 1 wherein the planar substrate has solder pads and the thumbwheel switch has leads extending from the body of the thumbwheel switch, the leads being embedded in the solder pads, the leads being selected from the group consisting of mechanical leads, electrical leads and combinations thereof.

4. The handheld electronic device of claim 3 wherein the planar substrate has holes filled with solder in which at least some of the mechanical leads are embedded.

5. The handheld electronic device of claim 4 wherein the body of the thumbwheel switch extends beyond the thumbwheel in at least two opposite directions and at least two of the mechanical leads are located on the body of the thumbwheel switch beyond the thumbwheel in the two opposite directions.

6. The handheld electronic device of claim 5 wherein the body of the thumbwheel switch has some L-shaped mechanical leads having a first flange secured to a sidewall of the body of the thumbwheel switch and a second flange flush with and secured to a first face of the planar substrate with the solder.

7. The handheld electronic device of claim 1 wherein the substrate has locating holes and the body has locating pins that seat in the locating holes.

8. The handheld electronic device of claim 1 wherein the housing has two parts joined along a parting line generally in a plane substantially parallel to the front face and the side opening is at the parting line.

9. A method of assembling a handheld electronic device comprising a housing having a front face, a thumbwheel switch having a body and a thumbwheel, and electronic components on a printed circuit board for the handheld electronic device, the printed circuit board having a substrate with electrical traces and an edge cutout, the substrate having a first face and a second face, the thumbwheel body having a top face, a recess formed in the top face, the thumbwheel body being positioned on the substrate with the top face of the body seated on the first face of the planar substrate, the top face of the body abutting the first face of the planar substrate, the thumbwheel body and electronic components having leads thereon at least some of which are circuit leads, the method comprising:
  applying solder paste to spots on the first face of the planar substrate to form solder pads, that for at least the circuit leads engage selected electrical traces;
  positioning the thumbwheel body of the thumbwheel switch, and the electronic components on the first face of the planar substrate with at least the circuit leads engaging solder pads to form an assembly and with the thumbwheel seated in the edge cutout, the thumbwheel seated in the recess of the top face of the thumbwheel body;
  securing the leads to the printed circuit board essentially by:
    heating the assembly to melt the solder pads and wet the leads with solder; and
    solidifying the solder by cooling to mechanically secure and electrically connect the thumbwheel switch and the electronic components to the first face of the substrate; and
  mounting a display in the front face of the housing, the printed circuit board being mounted in the housing with the planar substrate generally parallel to the front face, the thumbwheel switch located substantially behind the display and with the thumbwheel accessible through a side opening in the housing.

10. The method of claim 9 wherein the thumbwheel extends above the top face of the thumbwheel body about a thickness of the substrate such that the thumbwheel is about flush with the second face of the substrate.

11. The method of claim 9 wherein the positioning of the thumbwheel body and the other components on the substrate is performed by a machine.

12. The method claim 11 wherein the thumbwheel body has locating pins and the substrate has locating holes, and wherein positioning comprises engaging the locating pins in the locating holes.

13. The method of claim 9 wherein some of the circuit leads are mechanical leads that project from the thumbwheel body and the substrate has corresponding recesses in which solder paste is applied, the thumbwheel body being positioned with the mechanical leads extending into the solder in the corresponding recesses.

* * * * *